(12) United States Patent
Yamamuka et al.

(10) Patent No.: US 6,512,885 B1
(45) Date of Patent: Jan. 28, 2003

(54) LIQUID RAW MATERIAL VAPORIZER, SEMICONDUCTOR DEVICE AND METHOD OF MANUFACTURING SEMICONDUCTOR DEVICE

(75) Inventors: Mikio Yamamuka, Hyogo (JP);
Takaaki Kawahara, Hyogo (JP);
Masayoshi Tarutani, Hyogo (JP);
Tsuyoshi Horikawa, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/658,039

(22) Filed: Sep. 8, 2000

(30) Foreign Application Priority Data

Mar. 24, 2000  (JP) ........................ 2000-083623

(51) Int. Cl.$^7$ .............................. F24F 6/00; C23C 16/00
(52) U.S. Cl. ........................................ 392/394; 118/724
(58) Field of Search ................. 392/386, 388, 392/394, 396, 397, 398, 401, 402, 403, 405; 118/716, 723 VE, 724; 427/255.23, 255.26, 255.28

(56) References Cited

U.S. PATENT DOCUMENTS

| | | | | |
|---|---|---|---|---|
| 3,680,630 A | * | 8/1972 | Watts | 165/164 |
| 3,844,159 A | * | 10/1974 | Mizutani et al. | 374/21 |
| 3,889,538 A | * | 6/1975 | Fingerle | 122/39 |
| 4,139,762 A | * | 2/1979 | Pohrer et al. | 126/113 |
| 5,372,754 A | * | 12/1994 | Ono | 118/726 |
| 5,859,171 A | * | 1/1999 | Sawasaki et al. | 528/176 |
| 6,273,657 B1 | | 8/2001 | Yamamuka et al. | 118/724 |

* cited by examiner

*Primary Examiner*—Sang Paik
(74) *Attorney, Agent, or Firm*—McDermott, Will & Emery

(57) ABSTRACT

A vaporizing chamber is constituted by a vaporizer body and an upper vaporizer cover, and a raw material supply pipe for introducing a liquid raw material into the vaporizing chamber is connected to the upper vaporizer cover. In order to suppress transmission of heat from the vaporizing chambers and to the raw material supply pipe, a heat radiation preventing member is provided on a surface of an external wall of each of the vaporizing chambers and. Consequently, a liquid raw material vaporizer capable of suppressing the generation of a vaporization residue is provided, and a semiconductor device including a CVD film having a stable thickness and a method of manufacturing the semiconductor device are obtained.

7 Claims, 8 Drawing Sheets

LIQUID RAW MATERIAL VAPORIZER, SEMICONDUCTOR DEVICE AND METHOD OF MANUFACTURING SEMICONDUCTOR DEVICE

BACKGROUND OF THE INVENTION

1. Field of the Invention

The present invention relates to a vaporizer for vaporizing a liquid raw material, a semiconductor device manufactured by using the vaporizer, and a method of manufacturing the semiconductor device by using the vaporizer. More particularly, the vaporizer is to be used for a CVD (Chemical Vapor Deposition) apparatus in the field of a semiconductor manufacturing apparatus.

2. Description of the Background Art

In recent years, the integration of semiconductor memories and devices has rapidly been enhanced in order to increase the processing speed of the device, to reduce power consumption and to cut down costs. However, even if the integration is enhanced, a capacitor to be a component of a DRAM (Dynamic Random Access Memory) requires a prescribed capacity. For this reason, it is necessary to reduce the thickness of a capacitor dielectric layer.

However, reduction in the film thickness of silicon dioxide ($SiO_2$) which has been used as the capacitor dielectric layer has almost reached the limit. Consequently, vigorous studies and developments have been made to utilize a material having a high dielectric constant as the material of the capacitor dielectric layer and a metal material as the material of a capacitor electrode, in order to change the material of the capacitor dielectric layer to increase the dielectric constant. More specifically, tantalum oxide, lead zircon titanate (PZT), lead lanthanum zircon titanate (PLZT), strontium titanate (ST), barium titanate (BT), barium strontium titanate ((Ba, Sr) $TiO_3$ which will be hereinafter referred to as "BST") and the like have been studied as the material having a high dielectric constant, and platinum (Pt), ruthenium (Ru) and the like have been studied as the metal material.

In order to form the thin films of the material having a high dielectric constant and the metal material on the pattern of a semiconductor device having a difference in height, it is the most advantageous that the film formation should be carried out by a CVD method having excellent attachment properties to a substance having a complicated shape. However, there is a big problem in that no material has stable and excellent vaporization characteristic for a CVD raw material to form a thin film having a high dielectric constant and a metal thin film.

Under the circumstances, the present inventors have proposed a CVD raw material in Japanese Patent Laying—Open No. 7-268634 in which a conventional solid raw material is dissolved in an organic solvent, that is, tetrahydrofuran ($C_4H_8O$, hereinafter referred to as "THF") to remarkably enhance vaporization properties. However, even if a thin film having a high dielectric constant is formed with this raw material by using a conventional CVD apparatus for a liquid raw material, for example, for the formation of a $SiO_2$ film, good results cannot be obtained. Therefore, the present inventors have further proposed a CVD apparatus for a liquid raw material which can fully vaporize a liquid raw material to be supplied stably to a reaction chamber (Japanese Patent Laying—Open No. 8-186103).

FIG. 8 is a typical view schematically showing a solution vaporizing CVD apparatus for forming a thin film having a high dielectric constant which has been described in Japanese Patent Laying—Open No. Hei 8-186103. With reference to FIG. 8, the conventional CVD apparatus mainly has a liquid raw material vaporizer 101, liquid raw material vessels 102 to 105, a pressure pipe 106, liquid raw material flow controllers 107 to 110, a carrier gas supply pipe 111, a carrier gas flow controller 112, a connecting pipe 113, an oxidant supply pipe 114, a raw material gas transport pipe 115, a transport pipe heater 116, a reaction chamber 117 and a substrate heater 118.

Each of the four liquid raw material vessels 102 to 105 is connected to the pressure pipe 106, and is connected to the connecting pipe 113 through each of the liquid raw material flow controllers 107 to 110. The carrier gas supply pipe 111 is also connected to the connecting pipe 113 through the carrier gas flow controller 112.

The connecting pipe 113 is connected to a raw material supply pipe 123 of the liquid raw material vaporizer 101. The raw material gas transport pipe 115 extended toward the reaction chamber 117 is connected to the liquid raw material vaporizer 101. Moreover, the oxidant supply pipe 114 is provided to be extended toward the reaction chamber 117. There are provided the transport pipe heater 116 for heating the raw material gas transport pipe 115 and a heater for heating the oxidant supply pipe 114.

The substrate heater 118 for heating and holding a semiconductor substrate 119 is held in the reaction chamber 117.

Next, the operation of a conventional solution vaporizing CVD apparatus will be described.

A carrier gas flows from the carrier gas supply pipe 111 to the connecting pipe 113 with its a flow rate adjusted by the carrier gas flow controller 112. A solution raw material in the liquid raw material vessels 102 to 105 is pressurized by the pressure pipe 106 and the flow rate thereof is adjusted by the liquid raw material flow controllers 107 to 110. Then, the solution material is supplied to the connecting pipe 113 and is sprayed into the liquid raw material vaporizer 101.

The liquid raw material sprayed into the liquid raw material vaporizer 101 is vaporized in the liquid raw material vaporizer 101. The vaporized gas (raw material gas) is supplied into the reaction chamber 117 through the raw material gas transport pipe 115 heated by the transport pipe heater 116. The raw material gas reacts, in the reaction chamber 117, with an oxidant supplied from the oxidant supply pipe 114, and a thin film having a high dielectric constant or a metal thin film is formed on the semiconductor substrate 119 heated by the substrate heater 118.

An organic solvent THF and a solution raw material are provided in each of the liquid raw material vessels 102 to 105. The reaction chamber 117 is set at a pressure of approximately 133 Pa to approximately 1330 Pa in the $O_2$ atmosphere. A film is formed, with the heater set temperature of 400 to 600° C.

However, it has been found that a thin film having a high dielectric constant and a metal thin film cannot always be formed stably by using the solution vaporizing CVD apparatus. Actually, there have been the following problems. More specifically, foreign matters fall onto a semiconductor substrate (wafer), and a film forming rate, film properties (film composition and crystallinity) and electrical characteristics vary for each film formation.

The present inventors have investigated the cause. As a result, it has been found that the above-mentioned drawbacks are caused by a solid component such as an organic metal compound deposited from a liquid raw material in the liquid raw material vaporizer 101, which will be specifically described below with reference to the drawings.

FIG. 9 is a sectional view schematically showing the structure of a conventional liquid raw material vaporizer. With reference to FIG. 9, the liquid raw material vaporizer 101 includes a vaporizer body 120, an upper vaporizer cover 121, a rod heater 122 and a raw material supply pipe 123. The vaporizer body 120 and the upper vaporizer cover 121 constitute a vaporizing chamber, in which the rod heater 122 is embedded. The raw material supply pipe 123 for supplying a mixture of a liquid raw material and a carrier gas into the vaporizing chamber is connected to the upper vaporizer cover 121. Moreover, the vaporizer body 120 is provided with a vaporizing chamber outlet for discharging the vaporized raw material. A raw material gas transport pipe 115 for introducing the vaporized raw material to a reaction chamber is connected to the outlet of the vaporizing chamber. A transport pipe heater 116 is provided around the vaporizer outlet portion and the raw material gas transport pipe 115.

The vaporizer body 120 and the upper vaporizer cover 121 are formed of a metal, for example, a metal having a high thermal conductivity such as aluminum (Al) or copper (Cu). Moreover, a tube formed of PTFE (polytetrafluoroethylene) or polyimide is used for the raw material supply pipe 123, and a stainless tube is used for the raw material gas transport pipe 115.

In such a liquid raw material vaporizer 101, the liquid raw material is scattered or sprayed together with a carrier gas from a terminating and of the raw material supply pipe 123 into the vaporizing chamber. Then, the liquid raw material supplied into the vaporizing chamber collides with the internal wall of the vaporizing chamber. At this time, the vaporizer body 120 and the upper vaporizer cover 121 are heated by the rod heater 122. Therefore, the liquid raw material colliding with the internal wall of the vaporizing chamber is vaporized instantaneously. The liquid raw material thus vaporized (which will be hereinafter referred to as a "raw material gas") is discharged from the vaporizing chamber outlet portion and is supplied to the reaction chamber.

However, the vaporizer body 120 and the upper vaporizer cover 121 are heated by the rod heater 122. Therefore, the heat is also transmitted to the raw material supply pipe 123 connected to the upper vaporizer cover 121 so that the temperature of the raw material supply pipe 123 is raised. As a result, the solvent of the liquid raw material is partially vaporized in the raw material supply pipe 123 in some cases. When the solvent is thus vaporized partially, a part of an organic metal compound to be a solute dissolved in the liquid raw material is deposited as a solid in the raw material supply pipe 123 in some cases. The deposited organic chemical metal to be the raw material of a CVD film (which will be hereinafter referred to as a vaporization residue) is accumulated in the vaporizing chamber or the raw material supply pipe 123. Such an accumulated vaporization residue slightly changes the temperature of the internal wall of the vaporizing chamber. As a result, the vaporizing characteristics of the liquid raw material are affected. Consequently, the raw material gas cannot be fed stably from the vaporizing chamber to the reaction chamber 117. Thus, there is a problem in that the characteristics of the CVD film are deteriorated.

Moreover, the vaporization residue accumulated in the vaporizing chamber and the like is discharged as a powder solid component together with the vaporized raw material from the vaporizing chamber outlet portion and reaches the reaction chamber 117 in some cases. In these cases, the vaporization residue would be incorporated as a foreign matter into the CVD film in the reaction chamber 117. Consequently, a device using such a CVD film sometimes operates defectively.

If the above-mentioned CVD apparatus is used for a long period of time, the temperature of the internal wall of the vaporizing chamber is lowered by the vaporization residue accumulated in the vaporization chamber, affecting the vaporizing characteristics of the liquid raw material, so that more vaporization residues are increasingly accumulated in the vaporizer. For this reason, it is hard to stably obtain a CVD film having excellent properties, for a long period of time.

SUMMARY OF THE INVENTION

It is an object of the present invention to provide a liquid raw material vaporizer capable of suppressing the generation of a vaporization residue and of forming a film having stable properties.

It is another object of the present invention to provide a semiconductor device having a CVD film having stable properties and a method of manufacturing the semiconductor device.

A liquid raw material vaporizer according to the present invention serves to vaporize a liquid raw material obtained by dissolving an organic metal complex in a solvent, including a raw material supply pipe, a vaporizing chamber and suppressing means. The raw material supply pipe serves to guide the liquid raw material. The vaporizing chamber is connected to the raw material supply pipe and serves to heat and vaporize the liquid raw material introduced from the raw material supply pipe. The suppressing means is fixed to at least one of the vaporizing chamber and the raw material supply pipe and serves to suppress transmission of heat from the vaporizing chamber to the raw material supply pipe.

In the liquid raw material vaporizer according to the present invention, it is possible to suppress the transmission of heat from the vaporizing chamber to the raw material supply pipe through the suppressing means. Consequently, the temperature of the raw material supply pipe can be prevented from being raised. Consequently, the problem that a solvent is partially vaporized in the raw material supply pipe portion and a part of an organic metal compound is deposited as a solid can be prevented. In other words, the generation of a vaporization residue can be suppressed.

Consequently, the change in the temperature of the internal wall of the vaporizing chamber caused by the vaporization residue can be prevented. Therefore, it is possible to prevent the film characteristics from being deteriorated by the change in the temperature of the internal wall.

Moreover, it is possible to prevent the vaporization residue from being incorporated as a foreign matter in the film. Thus, it is possible to obtain a film having excellent characteristics.

Furthermore, decrease in the temperature of the internal wall of the vaporizing chamber caused by the vaporization residue can be prevented. Consequently, a vicious circle caused by the accumulation of the vaporization residue can also be prevented. Thus, a film having excellent characteristics can easily be obtained stably for a long period of time.

In the liquid raw material vaporizer, preferably, the suppressing means is a heat radiation preventing member provided on an external wall of the vaporizing chamber and formed of a material having a thermal emissivity lower than that of the vaporizing chamber.

The heat radiation preventing member can prevent heat from being radiated from the surface of the external wall of the vaporizing chamber. Consequently, the raw material supply pipe can be prevented from being heated by the radiation.

In the liquid raw material vaporizer, preferably, a material of the heat radiation preventing member is at least one selected from the group consisting of glass, polyimide, fiber, Teflon and a metal having a surface oxidized.

By selecting these materials, it is possible to set the thermal emissivity of the thermal radiation preventing member to be lower than that of the vaporizing chamber.

In the liquid raw material vaporizer, preferably, the suppressing means is a heat absorption preventing member provided to surround a peripheral surface of the raw material supply pipe and formed of a material which absorbs less heat than the raw material supply pipe.

By the heat absorption preventing member, it is possible to prevent the absorption of the heat radiated from the surface of the external wall of the vaporizing chamber. Consequently, it is possible to prevent the raw material supply pipe from being heated.

In the liquid raw material vaporizer, preferably, a material of the heat absorption preventing member is at least one selected from the group consisting of aluminum, copper, nickel and stainless steel.

By selecting these materials, it is possible to make the heat absorption preventing member absorb less heat than the raw material supply pipe.

In the liquid raw material vaporizer, preferably, the suppressing means is a heat insulating member provided between the vaporizing chamber and the raw material supply pipe and formed of a material having a thermal conductivity lower than that of the vaporizing chamber.

By the heat insulating member, the transmission of the heat from the vaporizing chamber to the raw material supply pipe can be blocked. Consequently, it is possible to prevent the raw material supply pipe from being heated.

In the liquid raw material vaporizer, preferably, the heat insulating member has a structure in which multiple heat insulating layers are superposed.

Consequently, the capability of blocking the transmission of the heat from the vaporizing chamber to the raw material supply pipe can be enhanced. Thus, the heating of the raw material supply pipe can be prevented still more.

In the liquid raw material vaporizer, preferably, a material of the heat insulating member is at least one selected from the group consisting of celluloid, polyimide, Teflon, fluoro rubber and silicone rubber.

By selecting these materials, it is possible to set the thermal conductivity of the heat insulating member to be lower than that of the vaporizing chamber.

A semiconductor device according to the present invention has a capacitor in which a capacitor dielectric layer including a material having a high dielectric constant is interposed between a pair of electrodes containing a metal, wherein a standard deviation of film thickness stability of at least one of the capacitor dielectric layer and the pair of electrodes is 3% or less.

The semiconductor device according to the present invention includes a capacitor electrode or a capacitor dielectric layer having a stable thickness of which standard deviation of film thickness stability is 3% or less.

The "standard deviation of film thickness stability" is calculated based on a value (deviation) obtained by subtracting a mean value (an expected value) from a thickness (a measured value) measured at a plurality of portions of the capacitor dielectric layer or the capacitor electrode which are optionally selected from the measured value. The "standard deviation of film thickness stability" represented by s is calculated based on the following equation.

$$S = \sqrt{(1/n)\Sigma(x_i - \bar{x})^2} \tag{1}$$

n: number of measured portions
$x_i$: measured value
$\bar{x}$: mean value

In the semiconductor device, preferably, a material of the capacitor dielectric layer includes at least one selected from the group consisting of tantalum oxide, lead zircon titanate, lead lanthanum zircon titanate, strontium titanate, barium titanate and barium strontium titanate.

By selecting these materials, a capacitor dielectric layer having a high dielectric constant can be obtained.

In the semiconductor device, preferably, the capacitor dielectric layer includes at least one of lead zircon titanate, lead lanthanum zircon titanate, and barium strontium titanate, and a standard deviation of stability of a composition ratio of the capacitor dielectric layer is 5% or less.

Consequently, it is possible to obtain a semiconductor device including a capacitor dielectric layer having a stable composition ratio.

A "standard deviation of stability of a composition ratio" is calculated from a value (deviation) by subtracting a population mean value (an expected value) from a composition ratio (a measured value) measured at a plurality of portions of the capacitor dielectric layer which are optionally selected from the measured value, and is obtained by the same equation as in the equation (1).

In the semiconductor device, preferably, a material of at least one of the pair of electrodes includes at least one of platinum and ruthenium.

By selecting these materials, the capacitor dielectric layer interposed between the electrodes can have a high dielectric constant.

The present invention provides a method of manufacturing a semiconductor device, including the steps of vaporizing a liquid raw material having an organic metal complex dissolved in a solvent by using a liquid raw material vaporizer and producing a vaporized raw material, introducing the vaporized raw material into a reaction chamber holding a semiconductor substrate therein and using the vaporized raw material, forming at least one of a capacitor electrode and a capacitor dielectric layer on the semiconductor substrate by a chemical vapor deposition method. The liquid raw material vaporizer includes a raw material supply pipe, a vaporizing chamber and suppressing means. The raw material supply pipe serves to guide the liquid raw material. The vaporizing chamber is connected to the raw material supply pipe and serves to heat and vaporize the liquid raw material introduced from the raw material supply pipe. The suppressing means is fixed to at least one of the vaporizing chamber and the raw material supply pipe and serves to suppress transmission of heat from the vaporizing chamber to the raw material supply pipe.

In the method of manufacturing a semiconductor device according to the present invention, the transmission of heat from the vaporizing chamber to the raw material supply pipe can be controlled in the liquid raw material vaporizer. Consequently, it is possible to manufacture a semiconductor device including a capacitor electrode or a capacitor dielectric layer having a stable thickness of which standard deviation of film thickness stability is 3% or less.

In the method of manufacturing a semiconductor device, preferably, the organic metal complex includes at least one selected from the group consisting of barium (Ba), strontium (Sr), titanium (Ti), zirconium (Zr), copper (Cu), aluminum (Al), niobium (Nb), platinum (Pt) and ruthenium (Ru).

Consequently, it is possible to form a capacitor dielectric layer formed of a material having a high dielectric constant or a capacitor electrode formed of a metal material, by a chemical vapor deposition method.

In the method of manufacturing a semiconductor device, preferably, the organic metal complex includes a divivaloyl-methane group (DPM) and a temperature of an internal wall of the vaporizing chamber is controlled to be 100° C. to 300° C.

Consequently, the liquid raw material can have excellent vaporizing characteristics.

In the method of manufacturing a semiconductor device, preferably, the solvent contains at least one of tetrahydrofuran and hexaphloroachiracetenate (HFA: $CF_3COCHCOCF_3$).

Consequently, the liquid raw material can have excellent vaporizing characteristics.

The foregoing and other objects, features, aspects and advantages of the present invention will become more apparent form the following detailed description of the present invention when taken in conjunction with the accompanying drawings.

DESCRIPTION OF THE PREFERRED EMBODIMENTS

Preferred embodiments of the present invention will be described below with reference to the drawings.

First Embodiment

Figure 1:
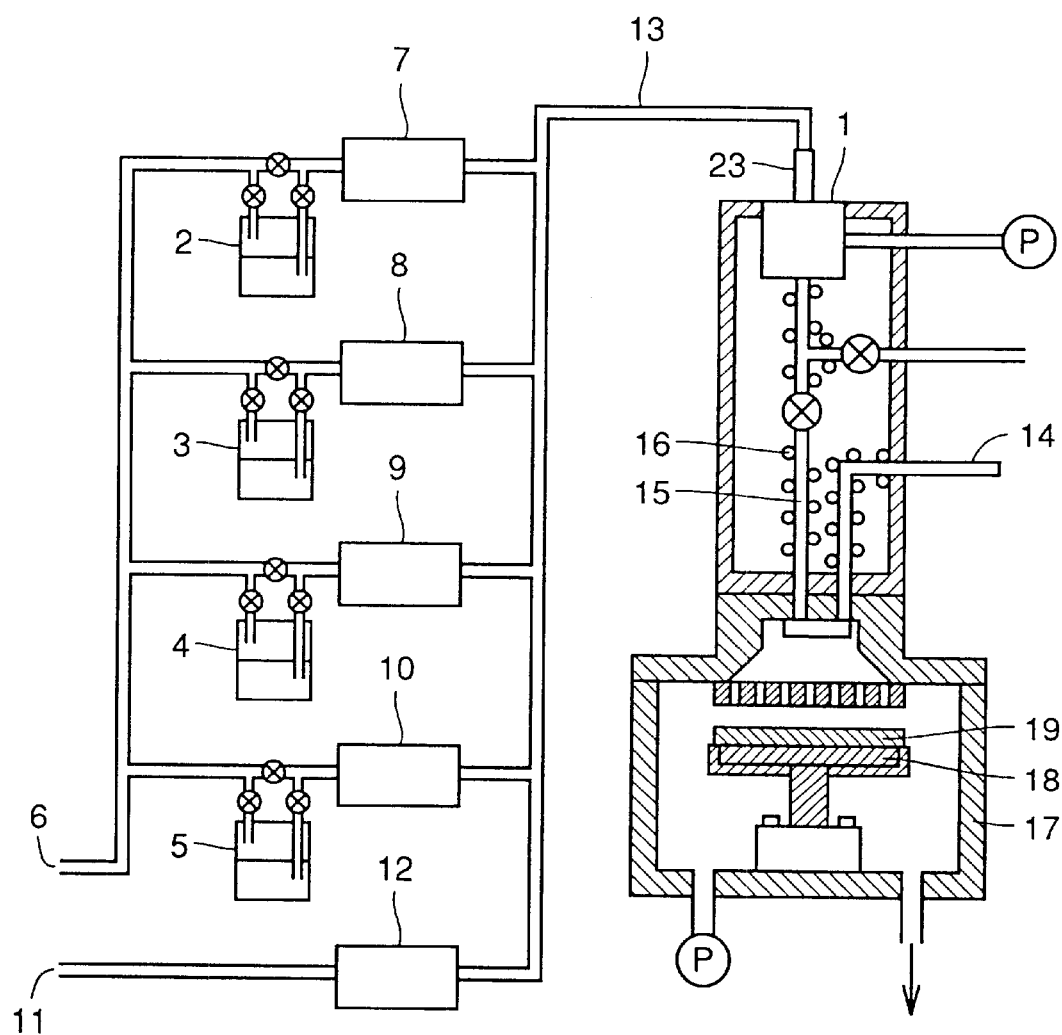
FIG. 1 is a typical view showing the structure of a solution vaporizing CVD apparatus including a liquid raw material vaporizer according to a first embodiment of the present invention.

With reference to FIG. 1, a solution vaporizing CVD apparatus mainly has a liquid raw material vaporizer 1 according to the present embodiment, liquid raw material vessels 2 to 5, a pressure pipe 6, liquid raw material flow controllers 7 to 10, a carrier gas supply pipe 11, a carrier gas flow controller 12, a connecting pipe 13, an oxidant supply pipe 14, a raw material gas transport pipe 15, a transport pipe heater 16, a reaction chamber 17 and a substrate heater 18.

Each of the liquid raw material vessels 2 to 5 is connected to the pressure pipe 6 through a valve, and is connected to the connecting pipe 13 through the valve and each of the liquid raw material flow controllers 7 to 10. The carrier gas supply pipe 11 is also connected to the connecting pipe 13 through the carrier gas flow controller 12.

In the case in which a BST film is to be formed, the liquid raw material vessels 2, 3 and 4 respectively contains a solution having solid raw materials such as Ba $(DPM)_2$, Sr $(DPM)_2$ and TiO $(DPM)_2$ each dissolved in THF. Moreover, the liquid raw material vessel 5 contains the THF.

The connecting pipe 13 is connected to a raw material supply pipe 23 of the liquid raw material vaporizer 1. The raw material gas transport pipe 15 is connected to the liquid raw material vaporizer 1 and is extended toward the reaction chamber 17. The oxidant supply pipe 14 is also extended toward the reaction chamber 17. The transport pipe heater 16 is provided around the raw material gas transport pipe 15, and a heater is also provided around the oxidant supply pipe 14.

The substrate heater 18 for heating and holding a semiconductor substrate 19 is held in the reaction chamber 17.

Next, the structure of the liquid raw material vaporizer 1 according to the present embodiment will be described.

Figure 2:
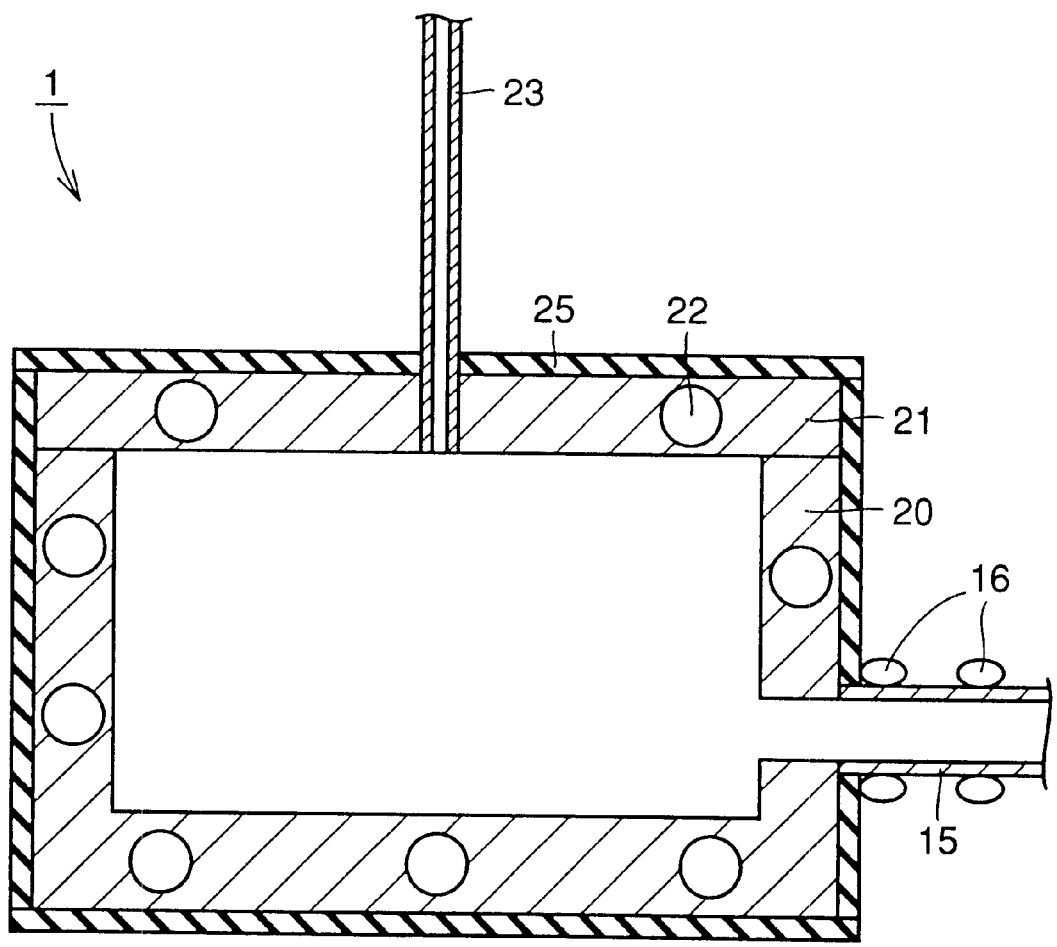
FIG. 2 is a sectional view schematically showing the structure of the liquid raw material vaporizer according to the first embodiment of the present invention.

With reference to FIG. 2, the liquid raw material vaporizer 1 mainly has a vaporizer body 20, an upper vaporizer cover 21, a rod heater 22, a raw material supply pipe 23 and a heat radiation preventing member 25.

The upper vaporizer cover 21 is held to cover the vaporizer body 20, thus providing a vaporizing chamber. The rod heater 22 is embedded in both the vaporizer body 20 and the upper vaporizer cover 21 such that the vaporizing chamber can be heated. The raw material supply pipe 23 serves to supply a liquid raw material into the vaporizing chamber, and is connected to the upper vaporizer cover 21.

The raw material gas transport pipe 15 for transporting the liquid material (raw material gas) vaporized in the vaporizing chamber to the reaction chamber is connected to the outlet of the vaporizing chamber.

The heat radiation preventing member 25 is provided on the surface of the external wall of the vaporizing chamber, and is formed of a material having a thermal emissivity lower than the thermal emissivities of the vaporizer body 20 and the upper vaporizer cover 21 which constitute the vaporizing chamber.

The heat radiation preventing member 25 is formed of a material having a thermal emissivity which is 0.1 time or less the thermal emissivities of the vaporizer body 20 and the upper vaporizer cover 21, for example, glass, polyimide, fiber, Teflon, a metal having a surface oxidized or any combination thereof The "thermal emissivity" represents a ratio of the luminance (or divergence) of heat radiation generated from a substance at a certain temperature to the luminance (or divergence) of heat radiation generated from a black body at the same temperature.

Each of the vaporizer body 20 and the upper vaporizer cover 21 is formed of a metal having a high thermal conductivity, for example, aluminum, copper or any combination thereof Moreover, the raw material supply pipe 23 is formed of PTFE, polyimide or the like, for example, and the raw material gas transport pipe 15 is formed of stainless or the like, for example.

Referring to the case in which a BST film is to be formed, description will be given to the operation of the solution vaporizing CVD apparatus including the liquid raw material vaporizer 1 according to the present embodiment.

With reference to FIG. 1, Ba, Sr and Ti solution raw materials in the liquid raw material vessels 2 and 3 and a solvent in the vessel 5 are pressurized and forced out with a gas fed from the pressure pipe 6. The liquid raw materials and solvent thus forced out are caused to flow out toward the connecting pipe 13 while each flow rate is adjusted by the liquid flow controllers 7 to 12. A carrier gas having flow rate controlled by the carrier gas flow controller 12 is caused to flow in advance from the carrier gas supply pipe 11 to the connecting pipe 13. Consequently, the liquid raw materials and the solvent are introduced together with the carrier gas into the liquid raw material vaporizer 1 through the connecting pipe 13.

With reference to FIG. 2, the vaporizing chambers 20 and 21 are preheated to a temperature of 100° C. to 300° C., for example, by means of the rod heater 22. Consequently, the liquid raw material sprayed into the vaporizing chambers 20 and 21 collides with the internal walls of the vaporizing chambers 20 and 21 and is vaporized instantaneously. The vaporized liquid raw material (raw material gas) is discharged from the outlets of the vaporizing chambers 20 and 21 toward the raw material gas transport pipe 15.

With reference to FIG. 1, the raw material gas discharged from the vaporizing chamber is supplied into the reaction chamber 17 through the raw material gas;transport pipe 15 heated by the heater 16. The raw material gas supplied into the reaction chamber 17 is mixed with an oxidant supplied by means of the oxidant supply pipe 14 and is then dropped over the semiconductor substrate 19 heated by the substrate heater 18. Consequently, a BST film is formed on the semiconductor substrate 19.

The inside of the reaction chamber 17 is set to have a pressure of approximately 133 Pa to approximately 1330 Pa in the $O_2$ atmosphere, for example, and the set temperature of the substrate heater 18 is set to 400° C. to 600° C. Moreover, the flow rate of the raw material gas and a time required for forming a film are so controlled that the BST film is formed at a film forming rate of approximately 3 nm/min to have the target thickness of 30 nm and composition ratio of (Ba+Sr)/Ti=1.0.

In the liquid raw material vaporizer according to the present embodiment, the heat radiation preventing member 25 is provided on the surfaces of the external walls of the vaporizer body 20 and the upper vaporizer cover 21. Consequently, becomes possible to prevent a rise in the temperature of the raw material supply pipe 23 caused by the heat radiation of the vaporizer body 20 and the upper vaporizer cover 21. More specifically, the temperature of the raw material supply pipe 23 has been reduced from approximately 200° C. in the conventional example to 40 to 50° C. Consequently, the amount of a vaporization residue generated in the vaporizing chamber has been reduced and the stability of a film thickness has been enhanced considerably during the continuous formation of several films. For example, in the case in which the BST film is formed as a thin film having a high dielectric constant, a standard deviation σ of the film thickness stability in the continuous formation of several hundred films has a value of 10% in the conventional solution vaporizing CVD apparatus, while the standard deviation σ has a value of 3% or less in the solution vaporizing CVD apparatus according to the present embodiment. Moreover, a standard deviation a of the stability of the composition ratio (Ba+Sr)/Ti of the BST film has been reduced from 10% in the conventional example to 5% or less.

Similarly, the standard deviation a of the film thickness stability could be reduced to 3% or less for a material having a high dielectric constant such as tantalum oxide, PZT, PLZT, ST or BT and a metal material such as platinum or ruthenium as well as the BST. Moreover, the standard deviation σ of the stability of the composition ratio could also be reduced to 5% or less for the PZT and PLZT as well as the BST.

Next, an example of the structure of the semiconductor device obtained through the film formation will be described.

Figure 3:
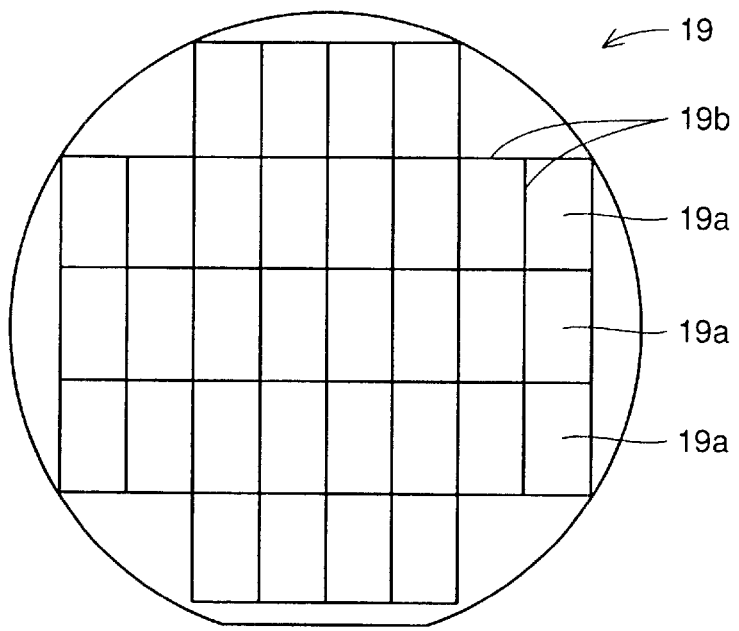
FIG. 3 shows the state of a wafer of a semiconductor device manufactured by using the solution vaporizing CVD apparatus illustrated in FIG. 1.
Figure 4:
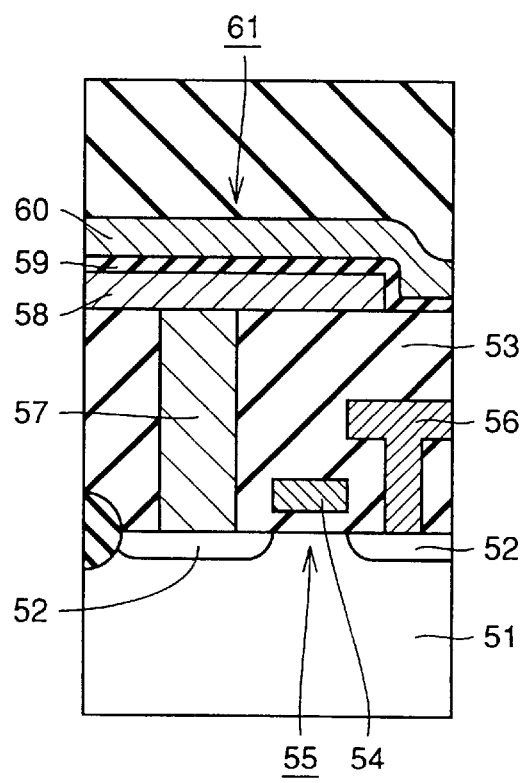
FIG. 4 is a schematical sectional view showing the structure of the semiconductor device manufactured by using the solution vaporization CVD apparatus including the liquid raw material vaporizer according to the first embodiment of the present invention.

With reference to FIGS. 3 and 4, the wafer 19 is provided with a plurality of chip regions 19*a* with a dicing line 19*b* extending therebetween. The wafer 19 is divided into the chips 19*a* by dicing along the dicing line 19*b*.

With reference to FIG. 4, a plurality of DRAM memory cells are formed on each of the chips 19*a*. Each memory cell has a 1-transistor and 1-capacitor structure having a MOS (Metal Oxide Semiconductor) transistor 55 and a capacitor 61. The transistor 55 is formed on a surface of the semiconductor substrate 51 isolated by a filed oxide film.

The transistor 55 has a pair of source/drain regions 52 and a gate electrode layer 54 formed on a region interposed by the source/drain regions 52 with a gate oxide film 53 provided therebetween.

The capacitor 61 is electrically connected to one of the source/drain regions 52 of the MOS transistor 55 through a plug layer 57. The capacitor 61 has a capacitor dielectric layer 59 formed of a material having a high dielectric constant and a pair of electrodes 58 and 60 interposing the capacitor dielectric layer 59 therebetween.

At least one of the lower electrode (storage node) 58 and the upper electrode (cell plate) 60 is formed of at least one of platinum and ruthenium, for example. Moreover, the capacitor dielectric layer 59 is formed of tantalum oxide, PZT, PLZT, ST, BT, BST of the like, for example.

At least one of the lower electrode 58, the capacitor dielectric layer 59 and the upper electrode 60 is formed by the solution vaporizing CVD apparatus shown in FIGS. 1 and 2.

When a film is formed by the solution vaporizing CVD apparatus shown in FIGS. 1 and 2, the standard deviation a of the film thickness stability of each of the lower electrode 58, the capacitor dielectric layer 59 and the upper electrode 60 has a value of 3% or less. When the capacitor dielectric layer 59 is formed of at least one of BST, PZT and PLZT and a film is formed by the solution vaporizing CVD apparatus shown in FIGS. 1 and 2, the standard deviation σ of the stability of the composition ratio of the film has a value of 5% or less. The standard deviation in the chip 19*a* is obtained based on a thickness or composition ratio measured on an optional point in the chip 19*a* of each film.

Second Embodiment

Figure 5:
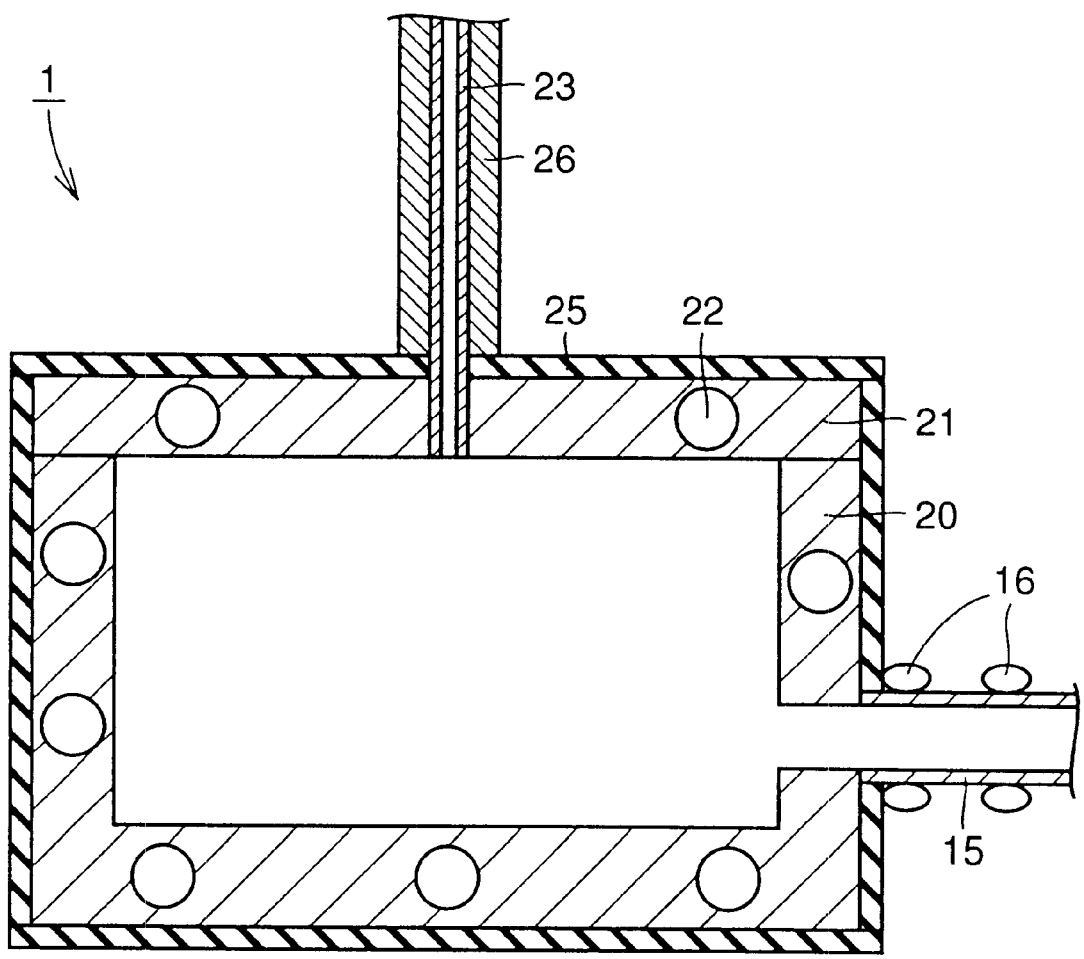
FIG. 5 is a sectional view schematically showing the structure of a liquid raw material vaporizer according to a second embodiment of the present invention.

With reference to FIG. 5, a heat absorption preventing member 26 is attached to cover the peripheral surface of a raw material supply pipe 23 in a solution raw material vaporizer 1 according to the present embodiment. The heat absorption preventing member 26 is formed of a material having a lower thermal absorptance than the thermal absorptance of the raw material supply pipe 23, and more specifically, is formed of a material having a thermal absorptance one-tenth the thermal absorptance of the raw material supply pipe 23 or less. The heat absorption preventing member 26 is formed of a material such as aluminum, copper, nickel, stainless steel or any combination thereof. The "thermal absorptance" represents a ratio of a heat energy absorbed by a substance to a heat energy incident on the substance.

Since other structures are almost the same as those in the first embodiment, the same members have the same reference numerals and their description will be omitted.

The structure of a solution vaporizing CVD apparatus including the liquid raw material vaporizer 1 is also the same as that shown in FIG. 1, and an example of a semiconductor device manufactured by the CVD apparatus is almost the same as the structure of the first embodiment shown in FIGS. 3 and 4.

In the present embodiment, the heat absorption preventing member 26 is provided to cover the peripheral surface of the raw material supply pipe 23. The heat absorption preventing member 26 hardly absorbs heat radiated from a vaporizer body 20 and an upper vaporizer cover 21. Consequently, the raw material supply pipe 23 hardly receives the heat from the vaporizer body 20 and the upper vaporizer cover 21. Thus, it is possible to prevent the temperature of the raw material supply pipe 23 from being raised. More specifically, the temperature of the raw material supply pipe 23 is reduced from approximately 200° C. in the conventional example to 40 to 50° C. Consequently, the amount of a vaporization residue generated in a vaporizing chamber is reduced and the stability of a thickness can be enhanced greatly during the continuous formation of several hundred films. For example, in the case in which a BST thin film having a high dielectric constant is formed, a standard deviation σ of the film thickness stability in the continuous formation of approximately several hundred films has a value of 10% in the conventional CVD apparatus, while the standard deviation a has a value of 3% or less in the solution vaporizing CVD apparatus according to the present embodiment. Moreover, a standard deviation a of the stability of the composition ratio (Ba+Sr)/Ti of the BST film is reduced from 10% in the conventional example to 5% or less.

Similarly, the standard deviation σ of the film thickness stability could be reduced to 3% or less for a material having a high dielectric constant such as tantalum oxide, PZT, PLZT, ST or BT and a metal material such as platinum or ruthenium as well as the BST. Moreover, the standard deviation σ of the stability of the composition ratio could also be reduced to 5% or less for the PZT and PLZT as well as the BST.

Third Embodiment

Figure 6:
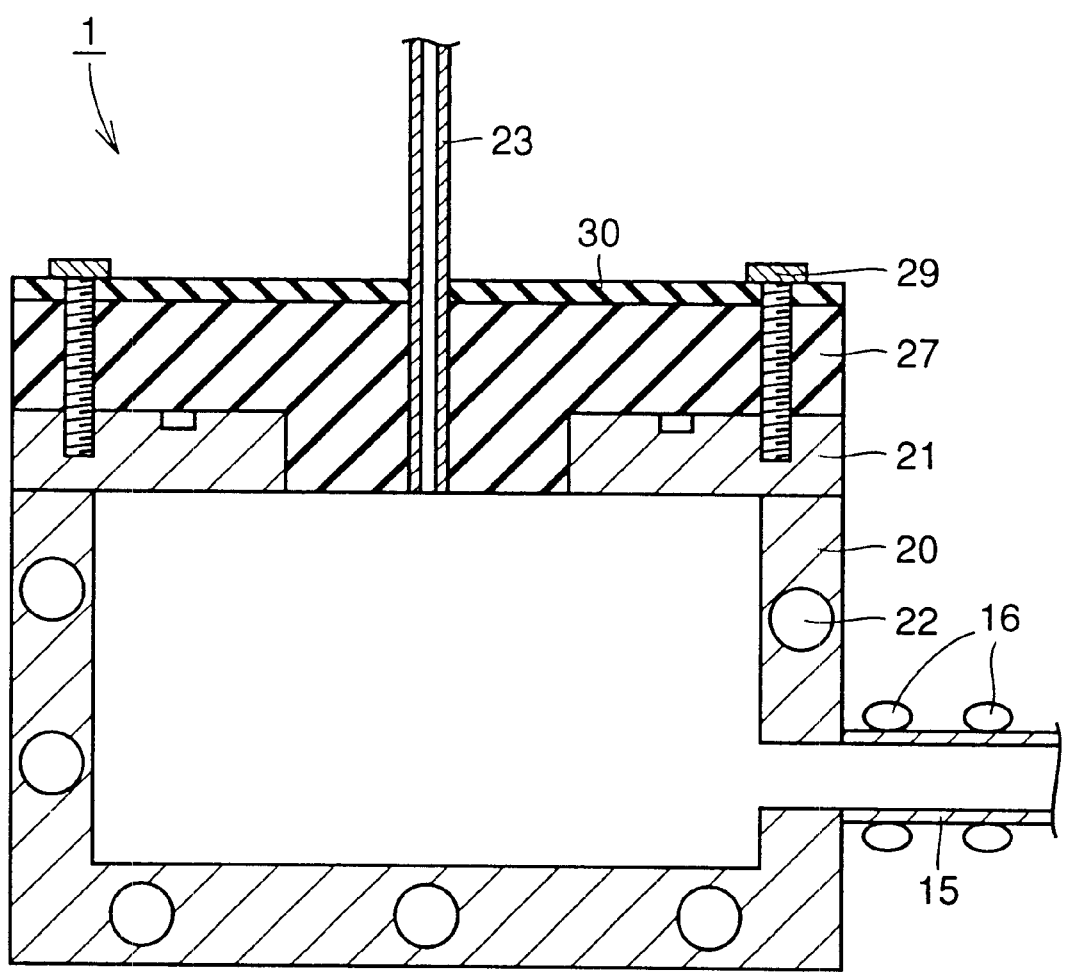
FIG. 6 is a sectional view schematically showing the structure of a liquid raw material vaporizer according to a third embodiment of the present invention.

With reference to FIG. 6, a liquid raw material vaporizer 1 according to the present embodiment has a heat insulating member 27 positioned between a raw material supply pipe 23 and an upper vaporizer cover 21. The heat insulating member 27 is fixed to the upper vaporizer cover 21 with a fixing screw 29 through a press plate 30.

The heat insulating member 27 is formed of a material having a thermal conductivity lower than the thermal conductivity of the upper vaporizer cover 21, and more specifically, is formed of a material having a thermal conductivity which is one-tenth the thermal conductivities of the upper vaporizer cover 21 and a vaporizer body 20 or less. The heat insulating member is formed of a material such as celluloid, polyimide, Teflon, fluoro rubber, silicone rubber or any combination thereof.

Since other structures are almost the same as those in the first embodiment, the same members have the same reference numerals and their description will not be repeated.

The structure of a solution vaporizing CVD apparatus using the liquid raw material vaporizer 1 is also the same as that of the first embodiment shown in FIG. 1, and an example of a semiconductor device manufactured by using the solution vaporizing CVD apparatus is almost the same as the structure of the first embodiment shown in FIGS. 3 and 4.

In the present embodiment, the heat insulating member 27 is provided between the raw material supply pipe 23 and the upper vaporizer cover 21. Therefore, it is possible to suppress heat conduction from the vaporizer body 20 and the upper vaporizer cover 21 which are heated by a rod heater 22 to the raw material supply pipe 23. Consequently, it is possible to reduce the temperature of the raw material supply pipe 23 to an ordinary temperature level and the ratio of the generation of a vaporization residue in a vaporization chamber after the formation of a film is reduced. As a result, the stability of a thickness can be enhanced considerably during the continuous formation of several hundred films. For example, where the BST film is formed as a thin film having a high dielectric constant, a standard deviation a of the film thickness stability in the continuous formation of several hundred films has a value of 10% in the conventional solution vaporizing CVD apparatus, while the standard deviation a has a value of 3% or less in the solution vaporizing CVD apparatus according to the present embodiment. Moreover, a standard deviation σ of the stability of the composition ratio (Ba+Sr)/Ti of the BST film is reduced from 10% in the conventional example to 5% or less.

Similarly, the standard deviation σ of the film thickness stability could be reduced to 3% or less for a material having a high dielectric constant such as tantalum oxide, PZT, PLZT, ST or BT and a metal material such as platinum or ruthenium as well as the BST. Moreover, the standard deviation σ of the stability of the composition ratio could also be reduced to 5% or less for the PZT and PLZT as well as the BST.

Fourth Embodiment

Figure 7:
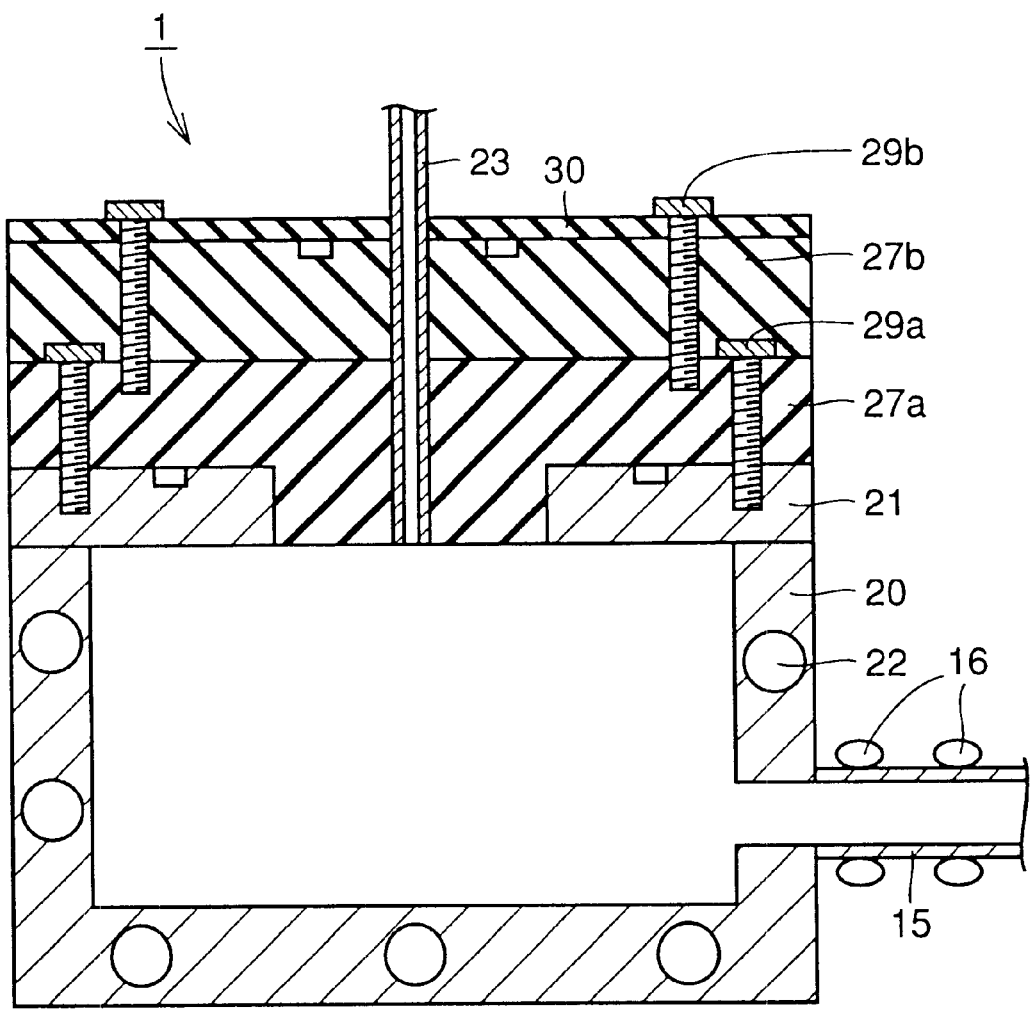
FIG. 7 is a sectional view schematically showing the structure of a liquid raw material vaporizer according to a fourth embodiment of the present invention.
Figure 8:
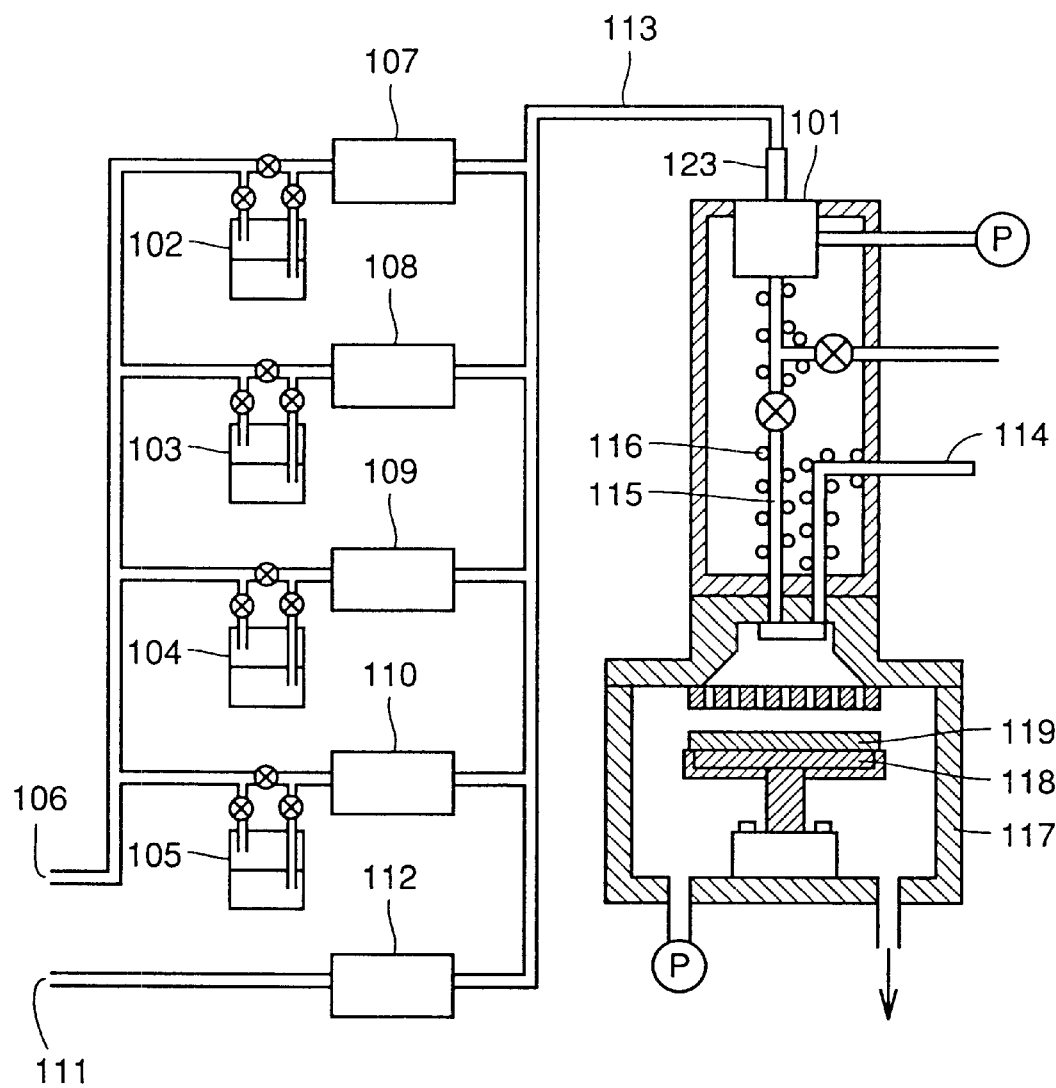
FIG. 8 is a typical view schematically showing the structure of a solution vaporization CVD apparatus including a conventional liquid raw material vaporizer.
Figure 9:
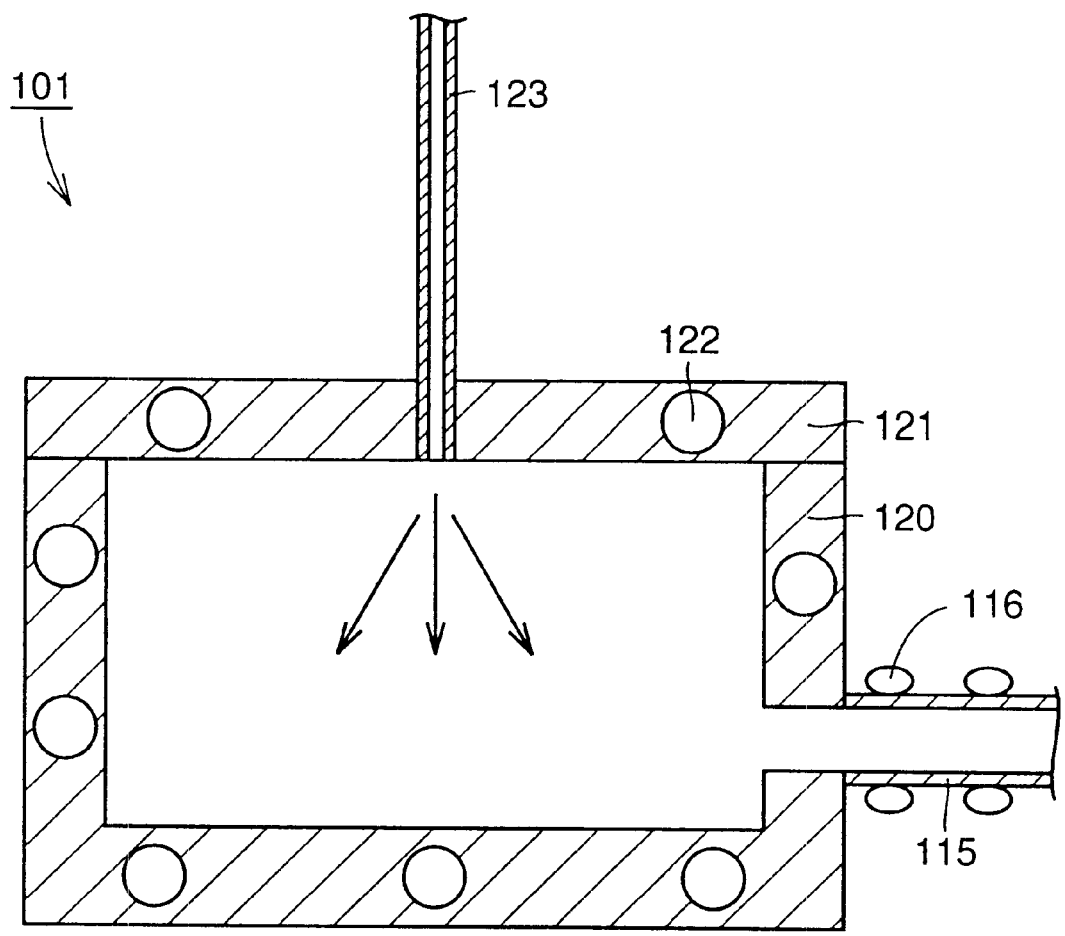
FIG. 9 is a sectional view schematically showing the structure of the conventional liquid raw material vaporizer.

With reference to FIG. 7, a heat insulating member interposed between the raw material supply pipe 23 and the upper vaporizer cover 21 has a multiple structure, for example, a double structure of heat insulating layers 27a and 27b in the present embodiment. The heat insulating layer 27a is fixed to the upper vaporizer cover 21 with a fixing screw 29a, and the heat insulating layer 27b is fixed to the heat insulating layer 27a with a fixing screw 29b through a press plate 30.

Moreover, the heat insulating layers 27a and 27b are formed of a material having a thermal conductivity lower than the thermal conductivity of the upper vaporizer cover 21, and more specifically, is formed of a material having a thermal conductivity which is one-tenth the thermal conductivities of the upper vaporizer cover 21 and a vaporizer body 20 or less. The heat insulating layers 27a and 27b are formed of a material such as celluloid, polyimide, Teflon, fluoro rubber, silicone rubber or any combination thereof.

Since other structures are almost the same as those in the third embodiment shown in FIG. 6, the same members have the same reference numerals and the description will not be repeated.

The structure of a solution vaporizing CVD apparatus using the liquid raw material vaporizer according to the present embodiment is almost the same as that of the first embodiment shown in FIG. 1, and an example of a semiconductor device manufactured by the solution vaporizing CVD apparatus is almost the same as the structure of the first embodiment shown in FIGS. 3 and 4.

In the present embodiment, the heat insulating member has a multiple structure (for example, a double structure). Therefore, it is possible to suppress the temperature of the raw material supply pipe 23 from being raised by heat radiation from the fixing screw 29a fixed to the upper vaporizer cover 21. Consequently, it is possible to reduce the temperature of the raw material supply pipe 23 to an ordinary temperature level, and the ratio of the generation of a vaporization residue in a vaporizing chamber after the formation of a film is reduced. More specifically, the temperature of the raw material supply pipe 23 has been reduced from approximately 200° C. to 20 to 30° C. Consequently, the amount of a vaporization residue generated in the vaporizing chamber has been reduced and the stability of a film thickness has been enhanced considerably during the continuous formation of several hundred films. For example, when the BST film is formed as a thin film having a high dielectric constant, a standard deviation σ of the film thickness stability in the continuous formation of several hundred films has a value of 10% in the conventional solution vaporizing CVD apparatus, while the standard deviation σ has a value of 3% or less in the solution vaporizing CVD apparatus according to the present embodiment. Moreover, a standard deviation σ of the stability of the composition ratio (Ba+Sr)/Ti of the BST film is reduced from 10% in the conventional example to 5% or less.

Furthermore, there has been obtained the effect that the a few foreign matters are generated by the vaporization residue reaching a wafer during the formation of the film, as compared with the several hundred foreign matters generated in the conventional example.

Similarly, the standard deviation σ of the film thickness stability could be reduced to 3% or less for a material having a high dielectric constant such as tantalum oxide, PZT, PLZT, ST or BT and a metal material such as platinum or ruthenium as well as the BST. Moreover, the standard deviation σ of the stability of the composition ratio could also be reduced to 5% or less for the PZT and PLZT as well as the BST.

The composition ratio of the BST film in the abovementioned embodiment was evaluated by fluorescent X-ray analysis. Moreover, the thickness of the BST film was measured by ellipsometry for 49 points in a wafer surface excluding the peripheral portion which has a size of 5 mm of the wafer. The standard deviation of the stability of continuous film formation was calculated based on a mean value of these points.

It is possible to use barium, strontium, titanium, zirconium, copper, aluminum, niobium, platinum, ruthenium or any combination thereof as an organic metal complex to be used for the method of manufacturing a semiconductor device according to each embodiment.

It is preferable that the organic metal complex should contain a DPM group. Moreover, hexaphloroachiracetenate as well as tetrahydrofuran may be used for a solvent. Alternatively, a solvent containing both tetrahydrofuran and hexaphloroachiracetenate may be used.

The heat radiation preventing member 25, the heat absorption preventing member 26, the heat insulating member 27 and the heat insulating members 27a and 27b having a multiple structure according to the first to fourth embodiments may be properly combined.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A liquid raw material vaporizer for vaporizing a liquid raw material obtained by dissolving an organic metal complex in a solvent, comprising:
   a raw material supply pip for guiding the liquid raw material;
   a vaporizing chamber connected to said raw material supply pipe and heating and vaporizing the liquid raw material introduced from said raw material supply pipe; and
   suppressing means fixed to at least one of said vaporizing chamber and said material supply pipe for suppressing transmission of heat from said vaporizing chamber to said raw material supply pipe, wherein
      said suppressing means is a heat radiation preventing member provided on an external wall of said vaporizing chamber and formed of a material having a thermal emissivity lower than that of said vaporizing chamber.

2. The liquid raw material vaporizer according to claim 1, wherein said suppressing means is a heat absorption preventing member provided to surround a peripheral surface of said raw material supply pipe and formed of a material which absorbs less heat than said raw material supply pipe.

3. A liquid raw material vaporizer for vaporizing a liquid raw material obtained by dissolving an organic metal complex in a solvent, comprising:
   a raw material supply pip for guiding the liquid raw material;
   a vaporizing chamber connected to said raw material supply pipe and heating and vaporizing the liquid raw material introduced from said raw material supply pipe; and
   suppressing means fixed to at least one of said vaporizing chamber and said material supply pipe for suppressing transmission of heat from said vaporizing chamber to said raw material supply pipe, wherein said suppressing means is a heat absorption preventing member provided to surround a peripheral surface of said raw material supply pipe and formed of a material which absorbs less heat than said raw material supply pipe.

4. The liquid raw material vaporizer according to claims 3, wherein a material of said heat absorption preventing member is at least one selected from the group consisting of aluminum, copper, nickel and stainless steel.

5. A liquid raw material vaporizer for vaporizing a liquid raw material obtained by dissolving an organic metal complex in a solvent, comprising:
   a raw material supply pip for guiding the liquid raw material;
   a vaporizing chamber connected to said raw material supply pipe and heating and vaporizing the liquid raw material introduced from said raw material supply pipe; and suppressing means fixed to at least one of said vaporizing chamber and said material supply pipe for suppressing transmission of heat from said vaporizing chamber to said raw material supply pipe, wherein said suppressing means is a heating insulating member provided between said vaporizing chamber and said raw material supply pipe and formed of a material having a thermal conductivity lower than that of said vaporizing chamber.

6. The liquid raw material vaporizer according to claim 5, wherein said heat insulating member has a structure in which multiple heat insulating layers are superposed.

7. The liquid raw material vaporizer according to claim 5, wherein a material of said heat insulating member is at least one selected from the group consisting of celluloid, polyimide, Teflon, fluoro rubber and silicone rubber.

* * * * *